United States Patent
Machida et al.

(10) Patent No.: US 7,312,140 B2
(45) Date of Patent: Dec. 25, 2007

(54) FILM FORMING METHOD

(75) Inventors: Hideaki Machida, Yamanashi (JP); Yoshio Ohshita, Aichi (JP); Atsushi Ogura, Tokyo (JP); Masato Ishikawa, Yamanashi (JP)

(73) Assignee: Tri Chemical Laboratories Inc., Kitatsuru-Gun (JP)

( * ) Notice: Subject to any disclaimer, the term of this patent is extended or adjusted under 35 U.S.C. 154(b) by 307 days.

(21) Appl. No.: 11/141,314

(22) Filed: Jun. 1, 2005

(65) Prior Publication Data

US 2006/0067230 A1      Mar. 30, 2006

(30) Foreign Application Priority Data

Sep. 30, 2004   (JP) ............... 2004-285721

(51) Int. Cl.
  *H01L 21/44*  (2006.01)
(52) U.S. Cl. ............ 438/597; 438/585; 438/649; 438/681; 438/685
(58) Field of Classification Search .......... 438/585, 438/597, 649, 681, 682, 683, 685
  See application file for complete search history.

(56) References Cited

U.S. PATENT DOCUMENTS

2005/0026428 A1 *  2/2005  Choi ............ 438/682
2006/0067230 A1    3/2006  Machida et al.
2006/0068100 A1    3/2006  Machida et al.
2006/0068101 A1    3/2006  Machida et al.
2006/0068103 A1    3/2006  Machida et al.

FOREIGN PATENT DOCUMENTS

| JP | 2002-009298 | 1/2002 |
| JP | 2002-353458 | 12/2002 |
| JP | 2003-258121 | 9/2003 |
| JP | 2004-031484 | 1/2004 |
| JP | 2004-207481 | 7/2004 |

* cited by examiner

*Primary Examiner*—Fernando L. Toledo
(74) *Attorney, Agent, or Firm*—Oblon, Spivak, McClelland, Maier & Neustadt, P.C.

(57) ABSTRACT

A technique is provided that is capable of employing raw materials having no halogen, which has a high possibility of exerting a bad influence upon semiconductor elements, thereby to easily form molybdenum films (molybdenum silicide films or molybdenum nitride films) of which purity is high at a low temperature.

A film forming material for forming molybdenum films, molybdenum silicide films, or tungasten nitride films is provided, wherein a Mo source of said film is one or more chemical compounds selected from the group consisting of a hexadimethylaminodimolybdenum, a hexaethylmethylaminodimolybdenum, and a hexadiethylaminodimolybdenum.

24 Claims, 2 Drawing Sheets

FILM FORMING METHOD

BACKGROUND OF THE INVENTION

The present invention relates to a forming method and a forming material of molybdenum films (or molybdenum silicide films, or molybdenum nitride films). Further, the present invention relates to a film formed by employing said material. Also, the present invention relates to elements such as semiconductor elements comprising said films.

At the present moment, the progress in the semiconductor fields is remarkable, and LSIs are being converted into ULSIs. And, so as to improve a signal processing speed, forming a fine-grained structure is being developed. Also, copper having a low resistance is selected as wiring conductor materials, and the spacing between wiring conductors is filled with materials having a very low dielectric constant. Moreover, A trend of extremely thinning a film goes up steadily. A conversion of a gate oxide film, which is currently made of $SiO_2$, into a metal oxide film such as $HfO_2$ has been also studied.

Additionally, the resistance of the gate electrode has also been perceived as a problem. Accordingly, it has been long wanted to develop new materials.

In order to overcome such problems, it has been studied to configure the gate electrode of molybdenum (Mo), being conductive metal.

[Patent document 1] JP-P2002-9298A
[Patent document 2] JP-P2002-353458A
[Patent document 3] JP-P2003-258121A
[Patent document 4] JP-P2004-31484A
[Patent document 5] JP-P2004-207481A By the way, the Mo thin film can be easily formed with a sputtering technique.

However, employing the sputtering to form a film of the gate electrode causes the semiconductor elements to be damaged physically.

For that reason, formation of the molybdenum thin films (wiring conductor films) with a chemical vapor deposition (CVD) process was intended in the semiconductor fields. That is, formation of the molybdenum thin film with the CVD process employing $MoCl_5$ was intended.

However, there is anxiety that Cl to be contained in raw materials($MoCl_5$) might exert a bad influence.

SUMMARY OF THE INVENTION

Thus, a first problem to be solved by the present invention is to provide a technology of forming molybdenum films (or molybdenum silicide films, or molybdenum nitride films) by employing the CVD process that hardly does a thermal damage to the semiconductor elements.

A second problem to be solved by the present invention is to provide a technology of employing halogen-free materials to form molybdenum films (or molybdenum silicide films, or molybdenum nitride films) because materials with halogens have a high possibility of exerting a bad influence upon the semiconductor elements.

A third problem to be solved by the present invention is to provide a technology capable of forming molybdenum films (or molybdenum silicide films, or molybdenum nitride films) of which purity is high.

A fourth problem to be solved by the present invention is to provide a technology capable of easily forming molybdenum films (or molybdenum silicide films or molybdenum nitride films) at a low temperature.

In the course of going aggressively with a research for solving the above-mentioned problems, the present inventor et al. noticed that it was very important to specify what should be employed as configuration materials of the molybdenum films (or the molybdenum silicide films, or the molybdenum nitride films).

And, as a result of further having continued the research, it has been found out that a chemical compound represented with the following general formula [I] is very preferably employed as a Mo source.

     General formula [I]:

where $R_1$, $R_2$, $R_3$, or $R_4$ is H or a hydrocarbon group respectively, each which has the same type or a different type.

Moreover, in addition hereto, it has been also found out that employing chemical compounds represented with $Si_xH_{(2x+2)}$, where X is an integer of 1 or more, allows more preferable silicide films to be produced.

Also, in addition hereto, it has been also found out that employing ammonia allows more preferable nitride films to be produced.

The present invention has been achieved based upon such knowledge.

That is, in order to solve the above-mentioned problems, a method is applied of forming a film containing molybdenum, comprising:

a Mo source supply step of supplying one or more Mo chemical compounds selected from the group of the following general formula [I] as a Mo source of said film; and a decomposition step of decomposing the Mo chemical compounds supplied in said Mo source supply step.

     General formula [I]:

where $R_1$, $R_2$, $R_3$, or $R_4$ is H or a hydrocarbon group respectively, each which has the same type or a different type.

Said Mo chemical compound is, particularly, one or more chemical compounds selected from the group consisting of a hexadimethylaminodimolybdenum, a hexaethylmethylaminodimolybdenum, and a hexadiethylaminodimolybdenum.

The method of the present invention is, particularly, a method of forming a film with a CVD process. And, said decomposition is a decomposition employing at least any one of the techniques selected from the group consisting of heat, light, and a hot filament.

The present invention is particularly employed in a case of forming a gate electrode film.

In particular, the present invention further comprises a reducing agent supply step of supplying a reducing agent (particularly, hydrogen).

In a case where said film is a molybdenum silicide film, the present invention further comprises:

an Si source supply step of supplying $Si_xH_{(2x+2)}$, where X is an integer of 1 or more, as an Si source of said molybdenum silicide film; and a decomposition step of decomposing the Si chemical compounds supplied in said Si source supply step.

Said Si chemical compound is, particularly, one or more chemical compounds selected from the group consisting of $SiH_4$, $Si_2H_6$, and $si_3H_8$.

Said Mo chemical compound and said Si chemical compound are supplied simultaneously or separately. And, they are decomposed simultaneously or separately.

In a case where said film is a molybdenum nitride film, the present invention further comprises:

an N source supply step of supplying one or more N chemical compounds selected from the group of ammonia and ammonia producing chemical compounds as an N source of said molybdenum nitride film; and a decomposition step of decomposing the N chemical compounds supplied in said N source supply step.

Said N chemical compound is, particularly, ammonia.

Said Mo chemical compound and said N chemical compound are supplied simultaneously or separately. And, they are decomposed simultaneously or separately.

The present invention provides a film containing molybdenum, said film being obtained through:

a Mo source supply step of supplying one or more Mo chemical compounds selected from the group of the following general formula [I] as a Mo source of said film; and a decomposition step of decomposing the Mo chemical compounds supplied in said Mo source supply step.

  General formula [I]:

where $R_1$, $R_2$, $R_3$, or $R_4$ is H or a hydrocarbon group respectively, each which has the same type or a different type.

Said Mo chemical compound is, particularly, one or more chemical compounds selected from the group consisting of a hexadimethylaminodimolybdenum, a hexaethylmethylaminodimolybdenum, and a hexadiethylaminodimolybdenum.

The film of the present invention is, particularly, a film formed with a CVD process. Particularly, it is a gate electrode film.

In the present invention, in a case where said film is a molybdenum silicide film, said film is obtained by further going through: an Si source supply step of supplying $Si_xH_{(2x+2)}$, where X is an integer of 1 or more, as an Si source of said molybdenum silicide film; and a decomposition step of decomposing the Si chemical compounds supplied in said Si source supply step.

Said Si chemical compound is, particularly, one or more chemical compounds selected from the group consisting of $SiH_4$, $Si_2H_6$, and $si_3H_8$.

In the present invention, in a case where said film is a molybdenum nitride film, said film is obtained by further going through: an N source supply step of supplying one or more N chemical compounds selected from the group of ammonia and ammonia producing chemical compounds as an N source of said molybdenum nitride film; and a decomposition step of decomposing the N chemical compounds supplied in said N source supply step.

Said N chemical compound is, particularly, ammonia.

Also, the present invention provides a film forming material for forming a film containing molybdenum, wherein a Mo source of said film is one or more Mo chemical compounds selected from the group of the following general formula [I].

In a case where said film is a molybdenum silicide film, the present invention provide a film forming material, wherein a Mo source of said film is one or more Mo chemical compounds selected from the group of the following general formula [I], and wherein an Si source of said film is one or more Si chemical compounds selected from the group consisting of $Si_xH_{(2x+2)}$, where X is an integer of 1 or more.

In a case where said film is a molybdenum nitride film, the present invention provides a film forming material, wherein a Mo source of said film is one or more Mo chemical compounds selected from the group of the following general formula [I], and where an N source of said film is one or more N chemical compounds selected from the group of ammonia and ammonia producing chemical compounds.

  General formula [I]:

where $R_1$, $R_2$, $R_3$, or $R_4$ is H or a hydrocarbon group respectively, each which has the same type or a different type.

Said Mo chemical compound is, particularly, one or more chemical compounds selected from the group consisting of a hexadimethylaminodimolybdenum, a hexaethylmethylaminodimolybdenum, and a hexadiethylaminodimolybdenum.

Said Si chemical compound is, particularly, one or more chemical compounds selected from the group consisting of $SiH_4$, $Si_2H_6$, and $si_3H_8$.

Said N chemical compound is, particularly, ammonia.

The film forming material of the present invention is a material for forming a film with a CVD process. In particularly, it is a material for forming a gate electrode film. In particular, it is a material for forming the gate electrode film in the semiconductor elements such as MOSFETs. Above all, it is a molybdenum silicide film. Or, it is a molybdenum nitride film.

Also, in order to solve the above-mentioned problems, the present invention provides a semiconductor element comprising molybdenum films, molybdenum silicide films, or molybdenum nitride films, wherein one or more Mo chemical compounds selected from the group of the following general formula [I] are supplied as a Mo source, and Mo of said film is configured by decomposing said supplied Mo chemical compounds.

  General formula [I]:

where $R_1$, $R_2$, $R_3$, or $R_4$ is H or a hydrocarbon group respectively, each which has the same type or a different type.

In accordance with the present invention, the molybdenum films, the molybdenum silicide films, or the molybdenum nitride films are obtained with the CVD process of hardly doing a thermal damage.

In addition hereto, this film employs halogen-free raw materials resulting in a minimal bad influence upon the semiconductor elements while maintaining high purity of the film. Moreover, the film has excellent conductivity. Accordingly, this film is preferred as a gate electrode.

And, the raw material to be employed for the present invention, particularly, the Mo raw material has a relative high vapor pressure. Accordingly, this material is easy to supply in performing the CVD process, and the film forming is easy.

BRIEF DESCRIPTION OF THE DRAWING

This and other objects, features and advantages of the present invention will become apparent upon a reading of the following detailed description and drawings, in which.

DESCRIPTION OF THE EMBODIMENTS

Figure 1:
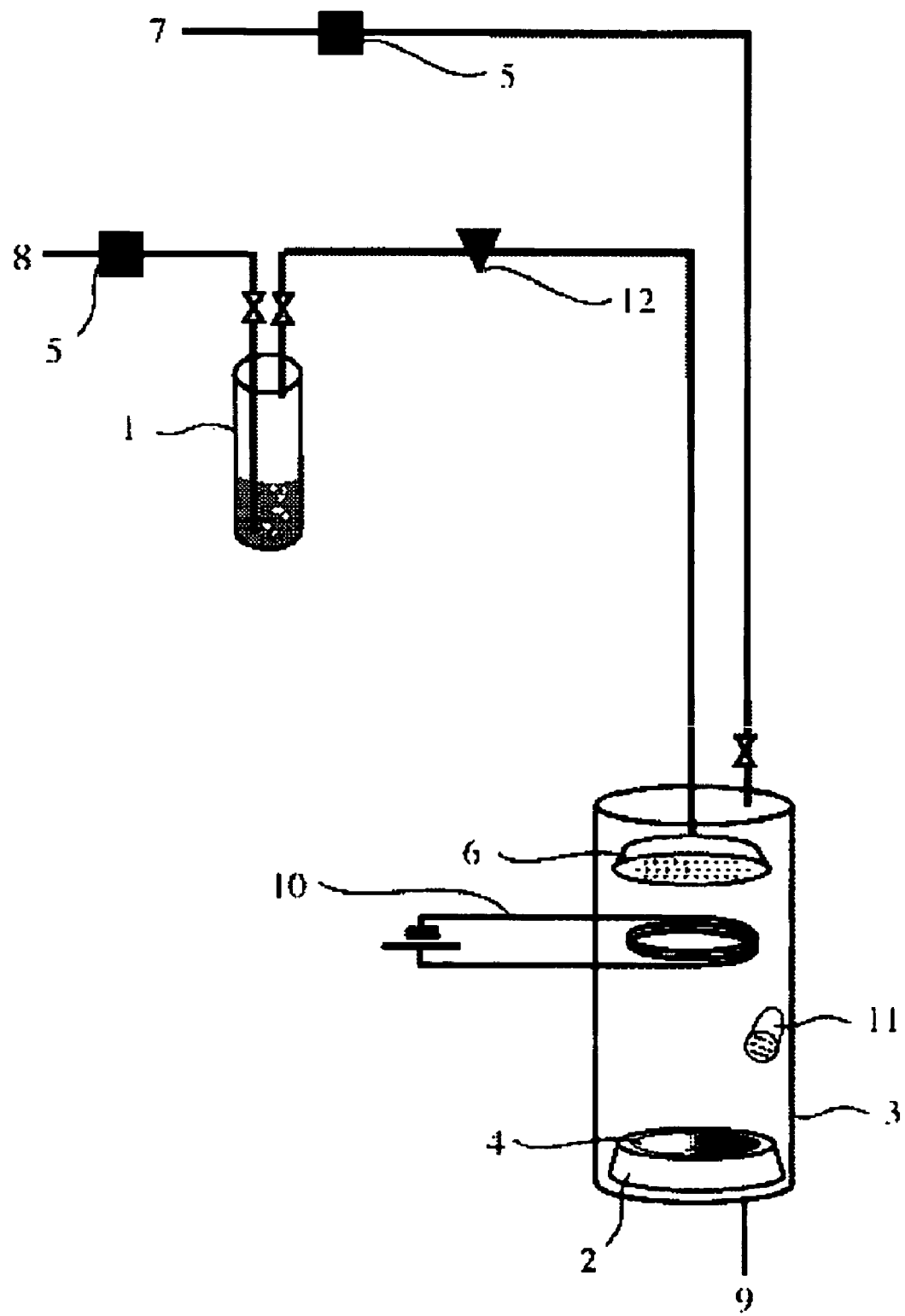
FIG. 1 is a schematic diagram illustrating a chemical vapor deposition (CVD) apparatus.

The present invention relates to a method of forming a film containing molybdenum. Said method comprises: a Mo source supply step of supplying one or more Mo chemical compounds selected from the group of the above-mentioned general formula [I] as a Mo source of said film; and a decomposition step of decomposing the Mo chemical compounds supplied in said Mo source supply step. Additionally, in the general formula [I], in a case where $R_1$, $R_2$, $R_3$, or $R_4$ is a hydrocarbon group, a carbon number thereof is preferably 1 to 25. More preferably, a carbon number is 1 to 10. The hydrocarbon group is, particularly, an alkyl group. Said Mo chemical compound is, particularly, one or more chemical compounds selected from the group consisting of a hexadimethylaminodimolybdenum, a hexaethylmethylaminodimolybdenum, and a hexadiethylaminodimolybdenum. The present invention, particularly, relates to a method of forming a film with the CVD process. The decomposition in the CVD process is a decomposition employing at least any one of the techniques selected from the group consisting of heat, light, and a hot filament. In particularly, the present invention further comprises a reducing agent supply step of supplying a reducing agent (particularly, hydrogen).

In a case where said film is a molybdenum silicide film, the present invention further comprises: an Si source supply step of supplying $Si_xH_{(2x+2)}$, where X is an integer of 1 or more, preferably, an integer of 10 or less, as an Si source of said molybdenum silicide film; and a decomposition step of decomposing the Si chemical compounds supplied in said Si source supply step. Said Si chemical compound is, particularly, one or more chemical compounds selected from the group consisting of $SiH_4$, $Si_2H_6$, and $Si_3H_8$. Said Mo chemical compound and said Si chemical compound are supplied simultaneously or separately. And, they are decomposed simultaneously or separately.

In a case where said film is a molybdenum nitride film, the present invention further comprises an N source supply step of supplying one or more N chemical compounds selected from the group of ammonia and ammonia producing chemical compounds (chemical compounds from which ammonia is produced by decomposition) as an N source of said molybdenum nitride film; and a decomposition step of decomposing the N chemical compounds supplied in said N source supply step. Said N chemical compound is, particularly, ammonia. Said Mo chemical compound and said N chemical compound are supplied simultaneously or separately. And, they are decomposed simultaneously or separately.

The film of the present invention is a film obtained with the above-mentioned methods.

The present invention provides a material for forming a film containing molybdenum. Said material is one or more Mo chemical compounds selected from the group of the above-mentioned general formula [I]. In particular, it is a Mo chemical compound explained in said method. Above all, the chemical compound, which most preferably configures the gate electrode, is a hexaethylmethylaminodimolybdenum.

In the present invention, in a case where said film is a molybdenum silicide film, an Si source of said molybdenum silicide film is $Si_xH_{(2x+2)}$, where X is an integer of 1 or more, and in addition, X is preferably an integer of 10 or less. In particular, it is an Si chemical compound explained in said method.

In the present invention, in a case where said film is a molybdenum nitride film, an N source of said molybdenum nitride film is one or more N chemical compounds selected from the group of ammonia and ammonia producing chemical compounds. In particular, it is an N chemical compound explained in said method.

Figure 2:
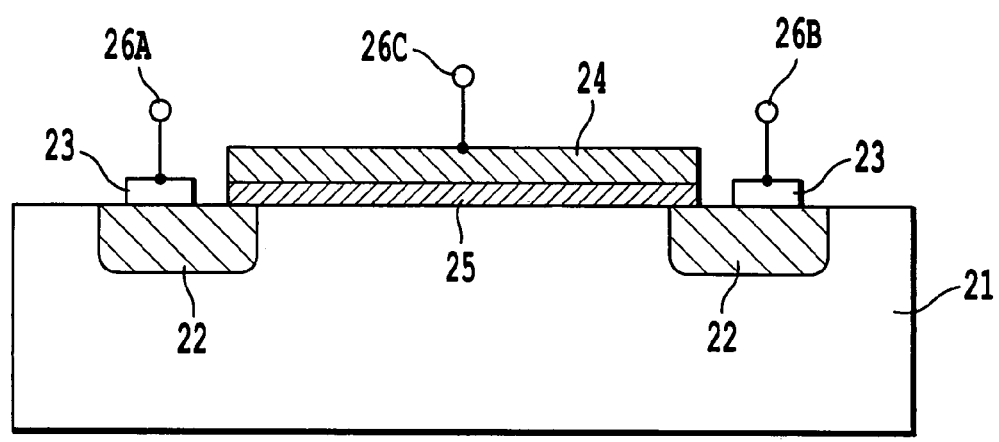
FIG. 2 is a schematic diagram illustrating a gate electrode film in semiconductor elements.

The film forming material of the present invention is a material for forming a film with the CVD process. In particular, it is a material for forming a gate electrode film. In particular, it is a material for forming a gate electrode film in the semiconductor elements such as MOSFETs. For example, FIG. 2 illustrates a semiconductor with substrate 21, doped regions 22, and source and drain regions 23. A gate electrode film 24 is formed on a gate oxide film 25. Wiring contacts 26A, 26B and 26C consisting of a metal are connected to the source and drain regions 23 and the gate electrode film 24 respectively. Above all, the film forming material of the present invention is a material for forming a molybdenum silicide film.

The semiconductor element of the present invention is a semiconductor element comprising the molybdenum film, the molybdenum silicide film, or the molybdenum nitride film. One or more Mo chemical compounds selected from the group of said general formula [I] are supplied as a Mo source, and Mo of said film is configured by decomposing said supplied Mo chemical compounds. In a case of the molybdenum silicide film, or the molybdenum nitride film, the chemical compounds mentioned before are supplied, and these films are configured by decomposing the above chemical compounds.

Specific embodiments will be described below.

Embodiment 1

FIG. 1 is a schematic diagram illustrating a chemical vapor deposition (CVD) apparatus. In the identical figure, 1 represents a raw material container, 2 represents a heater, 3 represents a decomposition reactor, 4 represents an Si (semiconductor) substrate, 5 represents a gas flow controller, 6 represents an a gas outlet of source gas, 7 represents a leading line of silane (or ammonia) such as $SiH_4$, $Si_2H_6$ and $Si_3H_8$, and $H_2$, 8 represents a leading line of carrier gas, 9 represents an exhaust line, 10 represents a ring-shape hot filament, 11 represents a photo-irradiation device, and 12 represents a needle valve for regulating pressure within the raw material container.

A hexadimethylaminodimolybdenum [$(Me_2N)_3MoMo(NMe_2)_3$] was placed in the container 1, and was maintained at 120° C. The decomposition reactor 3 was evacuated in vacuum. The substrate 4 was heated at 150-450° C., And, the needle valve 12 was released. This caused the vaporized $(Me_2N)_3MoMo(NMe_2)_3$ to be introduced into the decomposition reactor 3.

As a result, the film was formed on the substrate 4.

This film was investigated with an XPS (X-ray photoelectron spectroscopy). As a result, existence of Mo was confirmed. Also, it was investigated with an X-ray. As a result, it was confirmed that this film was a Mo film. Also, observing SEM (Scanning Electron Microscope) photographs and TEM (Transmission Electron Microscope) photographs of the section demonstrated that an interface was extremely flat. That is, it was founded out that no reaction occurred in the interface (Si) and the excellent interface was obtained.

This film was preferred for the gate electrode of the next generation semiconductor elements.

Embodiment 2

The embodiment 2 was carried out similarly to the embodiment 1 with the exception that a hexaethylmethylaminodimolybdenum was employed instead of $(Me_2N)_3MoMo(NMe_2)_3$.

As a result, the similar Mo film was formed. This film was preferred for the gate electrode of the next generation semiconductor elements. Additionally, these are more excellent than those of the embodiment 1.

Embodiment 3

The embodiment 3 was carried out similarly to the embodiment 1 with the exception that a hexadiethylaminodimolybdenum was employed instead of $(Me_2N)_3MoMo(NMe_2)_3$.

As a result, the similar Mo film was formed. This film was preferred for the gate electrode of the next generation semiconductor elements.

Embodiment 4

The embodiment 4 was carried out similarly to the embodiment 1 with the exception that $(Me_2N)_3MoMo(NMe_2)_3$ and $SiH_4$ were simultaneously introduced into the decomposition reactor 3 instead of introduction of only $(Me_2N)_3MoMo(NMe_2)_3$.

As a result, the film was formed on the substrate 4.

This film was investigated with the XPS. As a result, Mo and Si were confirmed. Also, it was investigated with an X-ray. As a result, it was confirmed that this film was a molybdenum silicide film. Also, observing the SEM photographs and the TEM photographs of the section demonstrated that an interface was extremely flat. That is, it was founded out that no reaction occurred in the interface (Si) and the excellent interface was obtained.

This film was preferred for the gate electrode of the next generation semiconductor elements.

Embodiment 5

The embodiment 5 was carried out similarly to the embodiment 4 with the exception that a hexaethylmethylaminodimolybdenum was employed instead of $(Me_2N)_3MoMo(NMe_2)_3$.

As a result, the molybdenum silicide film similar to that of the embodiment 4 was formed. This film was preferred for the gate electrode of the next generation semiconductor elements.

Embodiment 6

The embodiment 6 was carried out similarly to the embodiment 4 with the exception that a hexadiethylaminodimolybdenum was employed instead of $(Me_2N)_3MoMo(NMe_2)_3$.

As a result, the molybdenum silicide film similar to that of the embodiment 4 was formed. This film was preferred for the gate electrode of the next generation semiconductor elements.

Embodiment 7

The embodiment 7 was carried out similarly to the embodiment 4 with the exception that $Si_2H_6$ was employed instead of $SiH_4$.

As a result, the molybdenum silicide film similar to that of the embodiment 4 was formed. This film was preferred for the gate electrode of the next generation semiconductor elements.

Embodiment 8

The embodiment 8 was carried out similarly to the embodiment 4 with the exception that $Si_3H_8$ was employed instead of $SiH_4$.

As a result, the molybdenum silicide film similar to that of the embodiment 4 was formed. This film was preferred for the gate electrode of the next generation semiconductor elements.

Embodiment 9

The embodiment 9 was carried out similarly to the embodiment 1 with the exception that $(Me_2N)_3MoMo(NMe_2)_3$ and ammonia ($NH_3$) were simultaneously introduced into the decomposition reactor 3 instead of introduction of only $(Me_2N)_3MoMo(NMe_2)_3$.

As a result, the film was formed on the substrate 4.

This film was investigated with the XPS. As a result, Mo and N were confirmed. Also, it was investigated with the X-ray. As a result, it was confirmed that this film was a molybdenum nitride film. Also, observing the SEM photographs and the TEM photographs of the section demonstrated that an interface was extremely flat. That is, it founded out that no reaction in the interface (Si) and the excellent interface was obtained.

This film was preferred for the gate electrode of the next generation semiconductor elements.

Embodiment 10

The embodiment 10 was carried out similarly to the embodiment 9 with the exception that a hexaethylmethylaminodimolybdenum was employed instead of $(Me_2N)_3MoMo(NMe_2)_3$.

As a result, the molybdenum nitride film similar to that of the embodiment 9 was formed. This film was preferred for the gate electrode of the next generation semiconductor elements.

Embodiment 11

The embodiment 11 was carried out similarly to the embodiment 9 with the exception that a hexadiethylaminodimolybdenum was employed instead of $(Me_2N)_3MoMo(NMe_2)_3$.

As a result, the molybdenum nitride film similar to that of the embodiment 9 was formed. This film was preferred for the gate electrode of the next generation semiconductor elements.

Embodiment 12

In the embodiment 1, the decomposition of the chemical compounds was made with the heating means.

The embodiment 12 was carried out similarly to the embodiment 1 with the exception that the photo-irradiation means was employed instead of this heating means.

As a result, the similar Mo film was formed. This film was preferred for the gate electrode of the next generation semiconductor elements.

Embodiment 13

In the embodiment 1, the decomposition of the chemical compounds was made with the heating means.

The embodiment 13 was carried out similarly to the embodiment 1 with the exception that the laser-irradiation means was employed instead of this heating means.

As a result, the similar Mo film was formed. This film was preferred for the gate electrode of the next generation semiconductor elements.

Embodiment 14

In the embodiment 1, the decomposition of the chemical compounds was made with the heating means.

The embodiment 14 was carried out similarly to the embodiment 1 with the-exception that the decomposition was made with $(Me_2N)_3MoMo(NMe_2)_3$ brought into contact with the hot filament 10 heated at 800° C. or more on the way to the Si substrate 4 instead of this heating means for decomposition.

As a result, the similar Mo film was formed. This film was preferred for the gate electrode of the next generation semiconductor elements.

Particularly, the present invention can be usefully applied in the semiconductor fields.

What is claimed is:

1. A method of forming a film containing molybdenum, comprising:
    a Mo source supply step of supplying one or more Mo chemical compounds selected from the group of the following general formula [I] as a Mo source of said film; and
    a decomposition step of decomposing the Mo chemical compounds supplied in said Mo source supply step:

$$(R_1R_2N)_3MoMo(NR_3R_4)_3 \quad \text{General formula [I]:}$$

where $R_1$, $R_2$, $R_3$, or $R_4$ is H or a hydrocarbon group respectively, each which has the same type or a different type.

2. The method of forming the film as claimed in claim 1, wherein said Mo chemical compound is one or more chemical compounds selected from the group consisting of a hexadimethylaminodimolybdenum, a hexaethylmethylaminodimolybdenum, and a hexadiethylaminodimolybdenum.

3. The method of forming the film as claimed in claim 1, wherein said film is formed with a CVD process.

4. The method of forming the film as claimed in claim 1, wherein a gate electrode film is formed.

5. The method of forming the film as claimed in claim 1, wherein said decomposition is a decomposition employing at least any one of the techniques selected from the group consisting of heat, light, and a hot filament.

6. The method of forming the film as claimed in claim 1, further comprising a reducing agent supply step of supplying a reducing agent.

7. The method of forming the film as claimed in claim 6, wherein said reducing agent is hydrogen.

8. A method of forming a film containing Mo and Si, wherein said film is a molybdenum silicide film, comprising:
    a Mo source supply step of supplying one or more Mo chemical compounds selected from the group of the following general formula [I] as a Mo source of said film;
    a decomposition step of decomposing the Mo chemical compounds supplied in said Mo source supply step:
    an Si source supply step of supplying $Si_xH_{(2x+2)}$, where X is an integer of 1 or more, as an Si source of said film; and
    a decomposition step of decomposing the Si chemical compounds supplied in said Si source supply step.

$$(R_1R_2N)_3MoMo(NR_3R_4)_3 \quad \text{General formula [I]:}$$

where $R_1$, $R_2$, $R_3$, or $R_4$ is H or a hydrocarbon group respectively, each which has the same type or a different type.

9. The method of forming the film as claimed in claim 8, wherein said Mo chemical compound is one or more chemical compounds selected from the group consisting of a hexadimethylaminodimolybdenum, a hexaethylmethylaminodimolybdenum, and a hexadiethylaminodimolybdenum.

10. The method of forming the film as claimed in claim 8, wherein said film is formed with a CVD process.

11. The method of forming the film as claimed in claim 8, wherein a gate electrode film is formed.

12. The method of forming the film as claimed in claim 8, wherein said decomposition is a decomposition employing at least any one of the techniques selected from the group consisting of heat, light, and a hot filament.

13. The method of forming the film as claimed in claim 8, further comprising a reducing agent supply step of supplying a reducing agent.

14. The method of forming the film as claimed in claim 13, wherein said reducing agent is hydrogen.

15. The method of forming the film as claimed in claim 8, wherein said Si chemical compound is one or more chemical compounds selected from the group consisting of $SiH_4$, $Si_2H_6$, and $Si_3H_8$.

16. The method of forming the film as claimed in claim 8, wherein film forming materials are decomposed simultaneously or separately.

17. A method of forming a film containing Mo and N, wherein said film is a molybdenum nitride film, comprising:
    a Mo source supply step of supplying one or more Mo chemical compounds selected from the group of the following general formula [I] as a Mo source of said film;
    a decomposition step of decomposing the Mo chemical compounds supplied in said Mo source supply step:
    an N source supply step of supplying one or more N chemical compounds selected from the group of ammonia and ammonia producing chemical compounds as an N source of said film; and
    a decomposition step of decomposing the N chemical compounds supplied in said N source supply step.

$$(R_1R_2N)_3MoMo(NR_3R_4)_3 \quad \text{General formula [I]:}$$

where $R_1$, $R_2$, $R_3$, or $R_4$ is H or a hydrocarbon group respectively, each which has the same type or a different type.

18. The method of forming the film as claimed in claim 17, wherein said Mo chemical compound is one or more chemical compounds selected from the group consisting of a hexadimethylaminodimolybdenum, a hexaethylmethylaminodimolybdenum, and a hexadiethylaminodimolybdenum.

19. The method of forming the film as claimed in claim 17, wherein said film is formed with a CVD process.

20. The method of forming the film as claimed in claim 17, wherein a gate electrode film is formed.

21. The method of forming the film as claimed in claim 17, wherein said decomposition is a decomposition employing at least any one of the techniques selected from the group consisting of heat, light, and a hot filament.

22. The method of forming the film as claimed in claim 17, further comprising a reducing agent supply step of supplying a reducing agent.

23. The method of forming the film as claimed in claim 22, wherein said reducing agent is hydrogen.

24. The method of forming the film as claimed in claim 17, wherein film forming materials are decomposed simultaneously or separately.

* * * * *